(12) United States Patent
Togashi

(10) Patent No.: US 8,031,480 B2
(45) Date of Patent: *Oct. 4, 2011

(54) STRUCTURE FOR MOUNTING FEEDTHROUGH CAPACITORS

(75) Inventor: Masaaki Togashi, Tokyo (JP)

(73) Assignee: TDK Corporation, Tokyo (JP)

( * ) Notice: Subject to any disclaimer, the term of this patent is extended or adjusted under 35 U.S.C. 154(b) by 492 days.

This patent is subject to a terminal disclaimer.

(21) Appl. No.: 12/259,777

(22) Filed: Oct. 28, 2008

(65) Prior Publication Data

US 2009/0147489 A1 Jun. 11, 2009

(30) Foreign Application Priority Data

Dec. 7, 2007 (JP) ................................. 2007-317542

(51) Int. Cl.
*H05K 7/00* (2006.01)
(52) U.S. Cl. ........................................ 361/782; 361/760
(58) Field of Classification Search .................. 361/760, 361/761, 763, 302, 303, 305, 328, 782
See application file for complete search history.

(56) References Cited

U.S. PATENT DOCUMENTS

| 5,793,602 | A  | * | 8/1998 | Morecroft | 361/500 |
|---|---|---|---|---|---|
| 6,754,064 | B2 | * | 6/2004 | Azuma et al. | 361/302 |
| 6,900,978 | B2 |   | 5/2005 | Schimizu et al. | |
| 7,035,076 | B1 | * | 4/2006 | Stevenson | 361/302 |
| 7,580,240 | B2 | * | 8/2009 | Yamamoto et al. | 361/311 |
| 7,881,040 | B2 | * | 2/2011 | Togashi | 361/302 |
| 2005/0024813 | A1 | * | 2/2005 | Shimizu et al. | 361/328 |
| 2009/0161289 | A1 | * | 6/2009 | Yoshida | 361/303 |
| 2009/0290284 | A1 | * | 11/2009 | Gabler et al. | 361/321.2 |

FOREIGN PATENT DOCUMENTS

| JP | A-2003-282348 | 10/2003 |
|---|---|---|
| JP | A-2005-50962 | 2/2005 |
| JP | A-2007-129046 | 5/2007 |
| KR | A-2003-0077399 | 10/2003 |

* cited by examiner

*Primary Examiner* — Yuriy Semenenko
(74) *Attorney, Agent, or Firm* — Oliff & Berridge, PLC

(57) ABSTRACT

In a structure for mounting a first feedthrough capacitor and a second feedthrough capacitor on a mounting surface of a substrate, the first and second feedthrough capacitors are disposed so as to be substantially parallel and to face each other in their partial regions, and a current in the partial region of the first feedthrough capacitor flows in a direction opposite to that in the partial region of the second feedthrough capacitor.

4 Claims, 3 Drawing Sheets

(a)

(b)

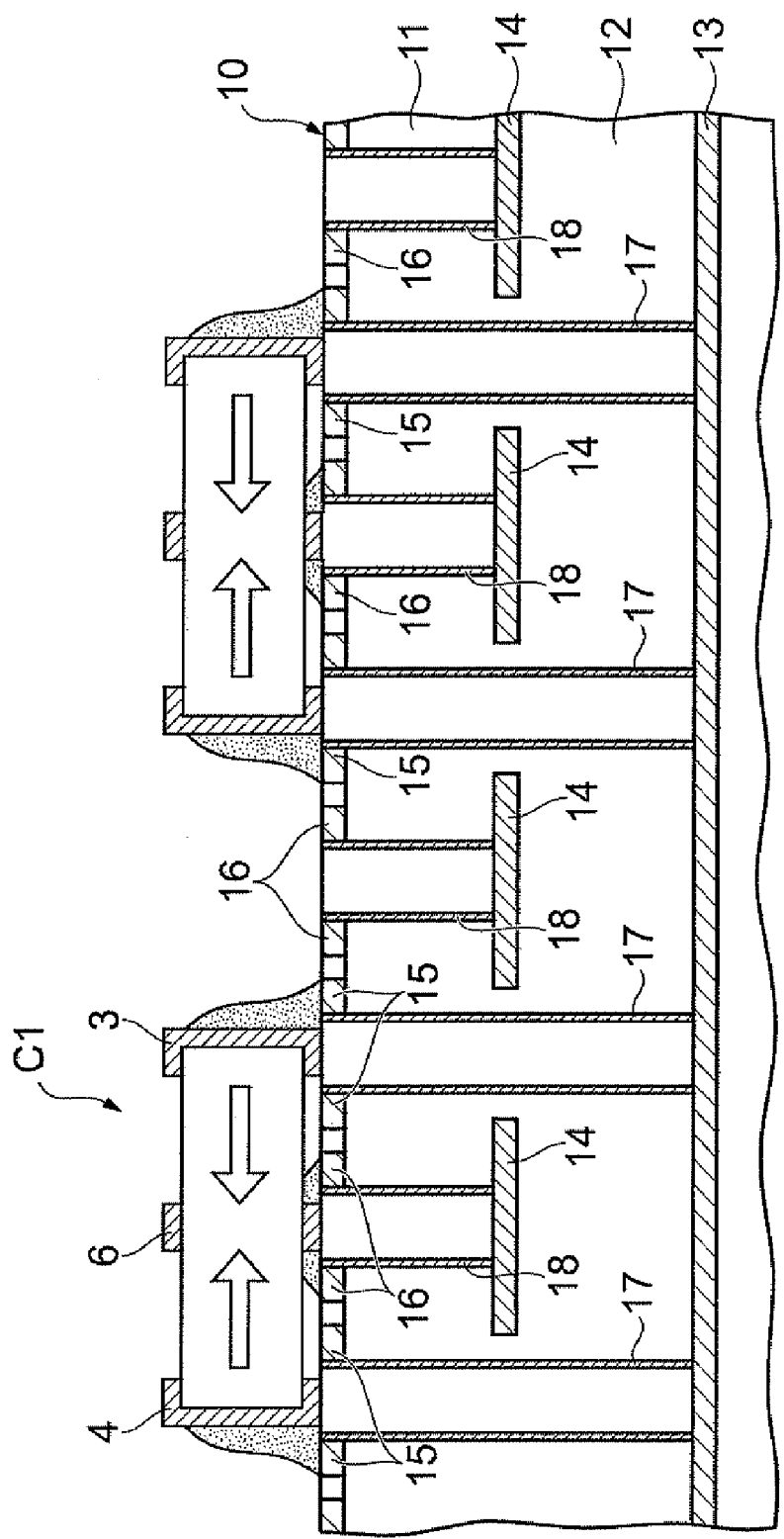

STRUCTURE FOR MOUNTING FEEDTHROUGH CAPACITORS

BACKGROUND OF THE INVENTION

1. Field of the Invention

The present invention relates to a structure for mounting feedthrough capacitors on a substrate.

2. Related Background Art

Such a structure is known in, for example, Japanese Patent Laid-Open Publication No. 2007-129046. In this structure, a multilayer substrate includes power supply grid terminals and ground grid terminals that are alternatively aligned in the row and column directions. A feedthrough capacitor is disposed on one ground grid terminal, and each terminal electrode of the feedthrough capacitor is soldered with the power supply grid terminal around this ground grid terminal.

SUMMARY OF THE INVENTION

In the structure for mounting in Japanese Patent Laid-Open Publication No. 2007-129046, a multilayer substrate on which two kinds of grid terminals are alternatively aligned is used to reduce equivalent series inductance (ESL). However, lower ESL is also required in the structure for mounting in Japanese Patent Laid-Open Publication No. 2007-129046.

Thus, it is an object of the present invention to provide a structure for mounting feedthrough capacitors on a substrate capable of reducing the ESL.

In a structure for mounting a first feedthrough capacitor and a second feedthrough capacitor on a mounting surface of a substrate in the present invention, the substrate is an insulating substrate including a first internal conductor and a second internal conductor insulated from each other, and includes first via holes extending from the mounting surface to the first internal conductor, second via holes extending from the mounting surface to the second internal conductor, a first land electrode formed on the mounting surface and connected to the first via hole, and a second land electrode formed on the mounting surface and connected to the second via hole insulated from the first land electrode. The first and second via holes are alternatively aligned in a matrix, and in the row and column directions in the mounting surface. The first and second feedthrough capacitors each includes a element body, two first terminal electrodes disposed on two opposite first end faces in the longitudinal direction of the element body, and second terminal electrodes disposed on second end faces orthogonal to the longitudinal direction of the element body. The first feedthrough capacitor is disposed between the two first via holes in a given row or column in the mounting surface. One of the first terminal electrodes in the first feedthrough capacitor is disposed on one of the two first via holes, and connected to the first land electrode. The other of the first terminal electrodes in the first feedthrough capacitor is disposed on the other of the two first via holes, and connected to the first land electrode. The second terminal electrodes in the first feedthrough capacitor are connected to the second land electrode. The second feedthrough capacitor is disposed between the two first via holes in a row or column parallel to the given row or column in the mounting surface so as to partially face the first feedthrough capacitor. One of the first terminal electrodes in the second feedthrough capacitor is disposed on one of the two first via holes, and connected to the first land electrode. The other of the first terminal electrodes in the second feedthrough capacitor is disposed on the other of the two first via holes, and connected to the first land electrode. The second terminal electrodes in the second feedthrough capacitor are connected to the second land electrode.

In a multilayer substrate of the present invention, the first and second via holes electrically connected to a first conductive layer and a second conductive layer, respectively, are alternatively aligned in the row and column directions. Therefore, currents along the via holes adjacent to each other flow in directions opposite to each other, which can reduce the ESL of the multilayer substrate.

The first feedthrough capacitor is disposed between the two first via holes in a given row or column, while the second feedthrough capacitor is disposed between the two first via holes in a row or column parallel to the given row or column. The first and second feedthrough capacitors are disposed so as to face each other in their partial regions. Therefore, the first and second feedthrough capacitors are aligned so as to face each other in the partial regions and to be substantially parallel in the mounting surface. In the first feedthrough capacitor, the first and second terminal electrodes are connected to the first and second land electrodes, respectively. In the second feedthrough capacitor, the first and second terminal electrodes are connected to the first and second land electrodes, respectively. Therefore, in the first and second feedthrough capacitors, a current flows, for example, from the first terminal electrode to the second terminal electrode. In the first and second feedthrough capacitors, a current flows from the first terminal electrode to the second terminal electrode, and their partial regions face each other and are substantially parallel. Currents in the partial regions flow in directions opposite to each other, thereby partially canceling magnetic fields caused by the currents. This can reduce the ESL of the feedthrough capacitors.

As described above, not only the substrate but also a position for mounting the feedthrough capacitor in the present invention is designed so as to achieve the low ESL.

Preferably, a region between one of the first end faces and a region for forming the second terminal electrodes in the element body of the first feedthrough capacitor faces a region between one of the first end faces and a region for forming the second terminal electrodes in the element body of the second feedthrough capacitor, while a region between the other of the first end faces and a region for forming the second terminal electrodes in the element body of the first feedthrough capacitor does not face a region between the other of the first end faces and a region for forming the second terminal electrodes in the element body of the second feedthrough capacitor.

In this case, regions in which currents flow in directions opposite to each other face each other in the first and second feedthrough capacitors. Therefore, since magnetic fields caused by the currents are more effectively canceled by each other, the ESL of the feedthrough capacitors can be more effectively reduced.

Preferably, the second feedthrough capacitor is disposed between the two first via holes in a row or column adjacent to the given row or column.

In this case, the first feedthrough capacitor is relatively close to the second feedthrough capacitor, thereby ensuring that magnetic fields caused by the currents cancel each other more effectively. Therefore, the ESL of the feedthrough capacitors can be more effectively reduced.

In a structure for mounting a first feedthrough capacitor and a second feedthrough capacitor on a mounting surface of a substrate in the present invention, the first and second feedthrough capacitors are disposed so as to be substantially parallel and to face each other in their partial regions, and a current in the partial region of the first feedthrough capacitor flows in a direction opposite to that in the partial region of the second feedthrough capacitor.

In the present invention, the first and second feedthrough capacitors aligned in substantially parallel face each other in their partial regions, and a current in the partial region of the first feedthrough capacitor flows in a direction opposite to that of the second feedthrough capacitor. Thereby, magnetic fields caused by the currents cancel each other partially in the first and second feedthrough capacitors. This can reduce the ESL of the first and second feedthrough capacitors to realize the structure for mounting with the low ESL.

The present invention can provide the structure for mounting feedthrough capacitors on a substrate capable of reducing ESL.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 3 is a cross sectional view of the structure taken along line III-III in FIG. 2.

DESCRIPTION OF THE PREFERRED EMBODIMENTS

Figure 1:
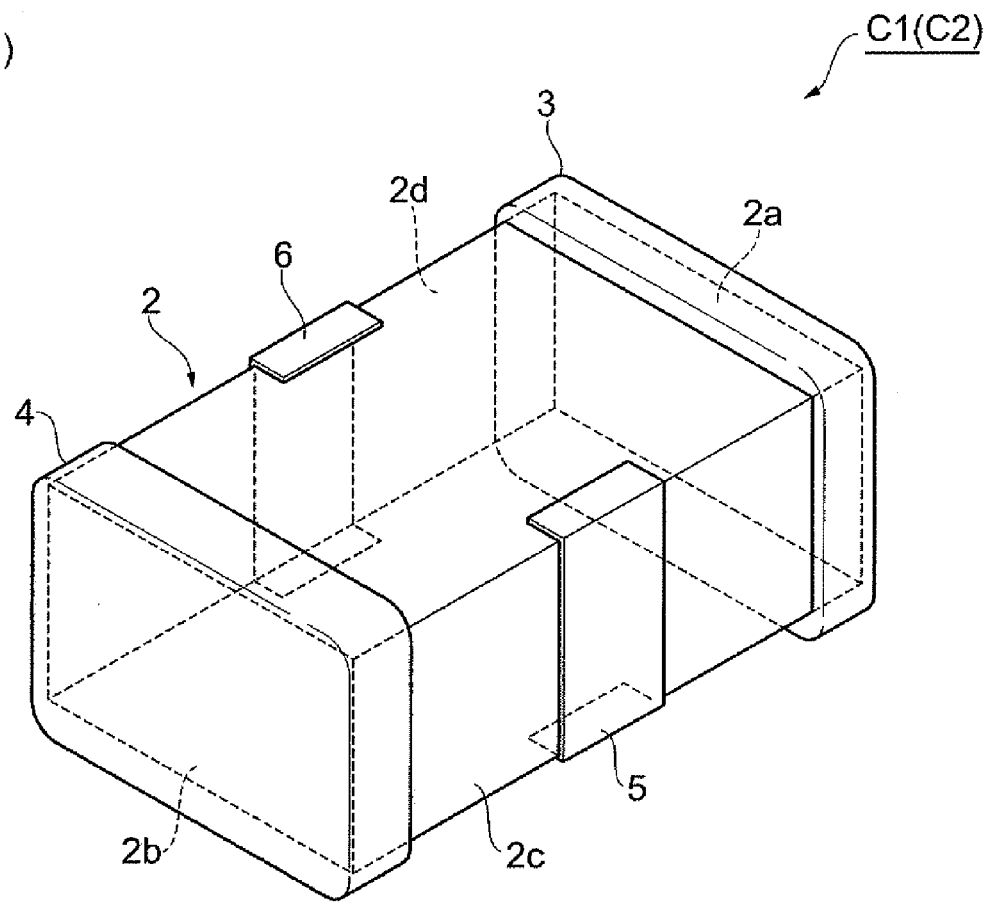
FIG. 1 shows a feedthrough capacitor in this embodiment.
Figure 1:
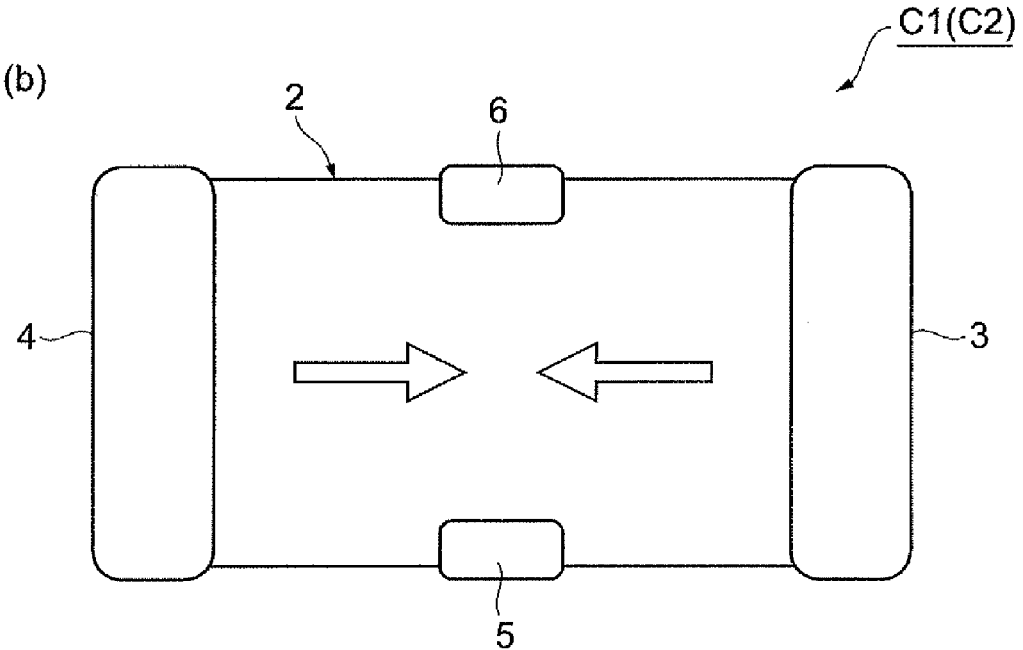

Preferred embodiments of the present invention will be described below with reference to the accompanying drawings in detail. In these descriptions, the same elements or elements having the same functions are denoted by the same reference numerals and repetitive descriptions thereon will be omitted.

With reference to FIG. 1, the structure of a feedthrough capacitor will be described. FIG. 1(a) is a perspective view of the feedthrough capacitor, and FIG. 1(b) is a top view of the feedthrough capacitor.

Feedthrough capacitors C1 and C2 are three-terminal feedthrough capacitors. The feedthrough capacitors C1 and C2 each include a substantially rectangular solid element body 2, two terminal electrodes 3 and 4, and two ground electrodes 5 and 6. The element body 2 includes a pair of opposite end faces 2a and 2b in the longitudinal direction of the element body 2, and a pair of end faces 2c and 2d substantially orthogonal to the end faces 2a and 2b.

The two terminal electrodes 3 and 4 cover the paired end faces 2a and 2b, respectively. The terminal electrodes 3 and 4 are multilayered. A sintered layer of, for example, Cu, Ni, or Ag—Pd is used as an inner layer in contact with the element body 2, while a plating layer of, for example, Ni—Sn is used as an outer layer.

The two ground electrodes 5 and 6 are formed in the substantial centers of the paired end faces 2c and 2d, respectively, and face each other. The ground electrodes 5 and 6 are also multilayered and are composed of similar materials to the terminal electrodes 3 and 4. The ground electrodes 5 and 6 are electrically insulated from the terminal electrodes 3 and 4 on the surface of the element body 2.

As shown by arrows in FIG. 1(b), in the feedthrough capacitors C1 and C2, currents flow from the terminal electrodes 3 and 4 to the ground electrodes 5 and 6.

Figure 2:
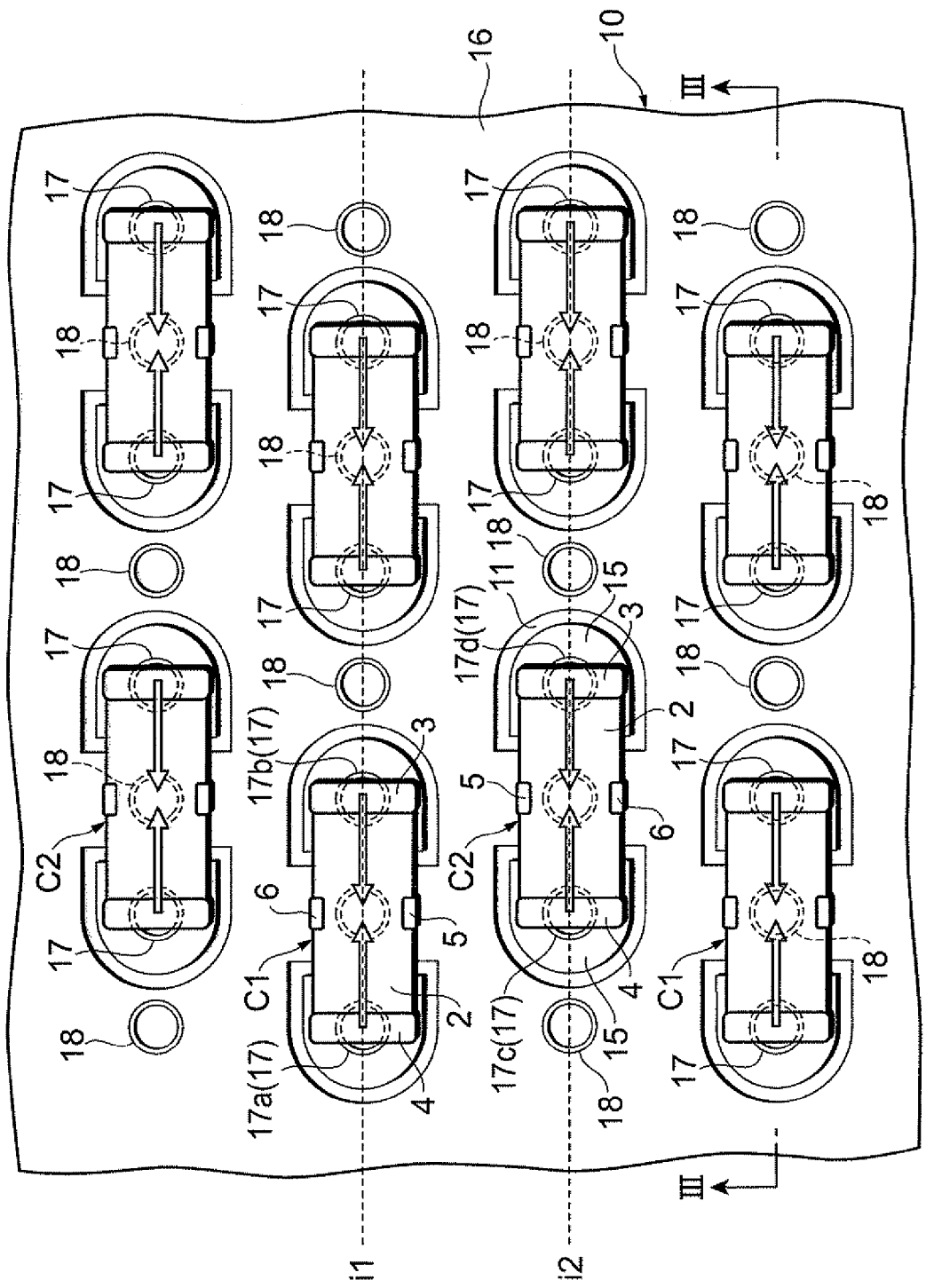
FIG. 2 is a plane view of the structure for mounting the feedthrough capacitors in this embodiment.

With reference to FIGS. 2 and 3, the structure for mounting the feedthrough capacitors will be described. FIG. 2 is a plane view of the structure for mounting the feedthrough capacitors in this embodiment. FIG. 3 is a cross sectional view of the structure taken along line III-III in FIG. 2. In order to facilitate visualization of FIG. 2, a soldering region between the feedthrough capacitor and a substrate is omitted in the drawing.

With reference to FIG. 3, a substrate 10 is an insulating substrate including a first insulating layer 11, a second insulating layer 12, a power supply conductive layer 13, and a ground conductive layer 14, in sequence from a mounting surface on which the feedthrough capacitors C1 and C2 are mounted.

The substrate 10 includes a power supply via hole 17 and a ground via hole 18. The power supply via hole 17 extends through the first and second insulating layers 11 and 12 from the mounting surface to the power supply conductive layer 13. The ground via hole 18 extends through the first insulating layer 11 from the mounting surface to the ground conductive layer 14.

With reference to FIG. 2 again, the power supply via hole 17 and the ground via hole 18 are formed in a matrix in the mounting surface of the substrate 10. The power supply via hole 17 and the ground via hole 18 are alternately aligned in the row and column directions. A distance between the power supply via hole 17 and the adjacent ground via hole 18 is substantially equal to half the longitudinal length of the feedthrough capacitors C1 and C2. Therefore, a distance between the two power supply via holes 17 aligned so as to sandwich one ground via hole 18 is substantially equal to the longitudinal length of the feedthrough capacitors C1 and C2.

The substrate 10 includes a power supply land electrode 15 and a ground land electrode 16. The power supply land electrode 15 and the ground land electrode 16 are disposed on the mounting surface of the substrate 10.

The power supply land electrode 15 is formed on the main surface of the first insulating layer 11 so as to surround the opening of the power supply via hole 17. The power supply land electrodes 15 are disposed in an island array, each electrode 15 corresponding to one power supply via hole 17. Each power supply land electrode 15 is connected to the power supply conductive layer 13 through the corresponding power supply via hole 17.

The ground land electrode 16 is formed on the main surface of the first insulating layer 11 so as to surround the opening of the ground via hole 18. The ground land electrode 16 covers a region other than a region for forming the power supply land electrode 15 in the main surface of the first insulating layer 11. A gap is provided between each power supply land electrode 15 and the ground land electrode 16, and the first insulating layer 11 is exposed from this gap. This insulates the power supply land electrode 15 from the ground land electrode 16. The ground land electrode 16 is connected to the ground conductive layer 14 through the ground via holes 18.

The feedthrough capacitors C1 and C2 are mounted on the mounting surface of the substrate 10 having the power supply land electrodes 15 and the ground land electrode 16. The feedthrough capacitor C1 is disposed between the two power supply via holes 17 in a given row in the mounting surface.

The feedthrough capacitor C1 is disposed in row i1, between the paired power supply via holes 17a and 17b aligned so as to sandwich one ground via hole 18 in the mounting surface. One ground via hole 18 is disposed between the paired power supply via holes 17a and 17b below the feedthrough capacitor C1.

The terminal electrode 3 of the feedthrough capacitor C1 is disposed adjacent to the power supply via hole 17b, and soldered with the power supply land electrode 15 corresponding to the power supply via hole 17b. This electrically connects the terminal electrode 3 of the feedthrough capacitor C1 to the power supply conductive layer 13 through the power supply land electrodes 15 and the power supply via hole 17b. The terminal electrode 4 of the feedthrough capacitor C1 is disposed adjacent to the power supply via hole 17a, and soldered with the power supply land electrode 15 corresponding to the power supply via hole 17a. This electrically connects the terminal electrode 4 of the feedthrough capacitor C1 to the power supply conductive layer 13 through the power supply land electrodes 15 and the power supply via hole 17a. The ground electrodes 5 and 6 of the feedthrough capacitor C1 are soldered with the ground land electrode 16 right below these electrodes. This electrically connects the ground electrodes 5 and 6 of the feedthrough capacitor C1 to the ground conductive layer 14 through the ground land electrode 16 and any of the ground via holes 18.

The feedthrough capacitor C2 is disposed between the two power supply via holes 17 in row i2 adjacent to the row i1 in the mounting surface. Specifically, the feedthrough capacitor C2 is disposed on the row i2, between the paired power supply via holes 17c and 17d aligned so as to sandwich one ground via hole 18 in the mounting surface. The power supply via hole 17c is diagonally adjacent to the power supply via holes 17a and 17b, disposed in the same column as the ground via hole 18 between the power supply via holes 17a and 17b. The power supply via hole 17d is diagonally adjacent to the power supply via hole 17b. One ground via hole 18 is disposed between the paired power supply via holes 17c and 17d below the feedthrough capacitor C2.

The terminal electrode 3 of the feedthrough capacitor C2 is disposed adjacent to the power supply via hole 17d, and soldered with the power supply land electrode 15 corresponding to the power supply via hole 17d. This electrically connects the terminal electrode 3 of the feedthrough capacitor C2 to the power supply conductive layer 13 through the power supply land electrodes 15 and the power supply via hole 17d. The terminal electrode 4 of the feedthrough capacitor C2 is disposed adjacent to the power supply via hole 17c, and soldered with the power supply land electrode 15 corresponding to the power supply via hole 17c. This electrically connects the terminal electrode 4 of the feedthrough capacitor C2 to the power supply conductive layer 13 through the power supply land electrodes 15 and the power supply via hole 17c. The ground electrodes 5 and 6 of the feedthrough capacitor C2 are soldered with the ground land electrode 16 right below these electrodes. This electrically connects the ground electrodes 5 and 6 of the feedthrough capacitor C2 to the ground conductive layer 14 through the ground land electrode 16 and any of the ground via holes 18.

The feedthrough capacitors C1 and C2 mounted as described above partially face each other. A region between the terminal electrode 3 and the ground electrodes 5 and 6 in the element body 2 of the feedthrough capacitor C1 faces a region between the terminal electrode 4 and the ground electrodes 5 and 6 in the element body 2 of the feedthrough capacitor C2. In other words, as viewed from a direction orthogonal to longitudinal directions of the bodies 2 in the feedthrough capacitors C1 and C2 and parallel to the mounting surface, the region between the terminal electrode 3 and the ground electrodes 5 and 6 in the element body 2 of the feedthrough capacitor C1 is overlapped with the region between the terminal electrode 4 and the ground electrodes 5 and 6 in the element body 2 of the feedthrough capacitor C2. A region between the terminal electrode 4 and the ground electrodes 5 and 6 in the element body 2 of the feedthrough capacitor C1 does not face a region between the terminal electrode 3 and the ground electrodes 5 and 6 in the element body 2 of the feedthrough capacitor C2. The feedthrough capacitors C1 and C2 are disposed so that the region between the terminal electrode 3 and the ground electrodes 5 and 6 of the feedthrough capacitor C1 and the region between the terminal electrode 4 and the ground electrodes 5 and 6 of the feedthrough capacitor C2 face each other and are substantially parallel to each other.

In the structure for mounting of this embodiment, the power supply via holes 17 connected to the power supply conductive layer 13 and the ground via holes 18 connected to the ground conductive layer 14 are alternately aligned in the substrate 10 for mounting the feedthrough capacitors C1 and C2 in the row and column directions. A current flows along the power supply via hole 17 in a direction opposite to that along the adjacent ground via hole 18, thereby reducing the ESL of the substrate 10.

The feedthrough capacitors C1 and C2 are disposed in substantially parallel so that the region between the terminal electrode 3 and the ground electrodes 5 and 6 of the feedthrough capacitor C1 faces the region between the terminal electrode 4 and the ground electrodes 5 and 6 of the feedthrough capacitor C2. In the feedthrough capacitors C1 and C2, currents flow from the terminal electrode 3 to the ground electrodes 5 and 6. Since the terminal electrode 3 of the feedthrough capacitor C1 is disposed on the power supply via hole 17b, a current flows between the terminal electrode 3 and the ground electrodes 5 and 6 of the feedthrough capacitor C1 in a direction from the power supply via hole 17b to the power supply via hole 17a. Since the terminal electrode 4 of the feedthrough capacitor C2 is disposed on the power supply via hole 17c, a current flows between the terminal electrode 4 and the ground electrodes 5 and 6 of the feedthrough capacitor C2 in a direction from the power supply via hole 17c to the power supply via hole 17d. Therefore, in the feedthrough capacitors C1 and C2, a current between the terminal electrode 3 and the ground electrodes 5 and 6 of the feedthrough capacitor C1 flows in a direction opposite to that between the terminal electrode 4 and the ground electrodes 5 and 6 of the feedthrough capacitor C2. Thereby, magnetic fields caused by the currents cancel each other partially to reduce the ESL of the feedthrough capacitors C1 and C2.

Since this reduces the ESL of not only the substrate 10 but also the feedthrough capacitors C1 and C2, the ESL in the structure for mounting can be further reduced.

In this embodiment, the feedthrough capacitor C1 is disposed on the row i1, between the power supply via holes 17a and 17b aligned so as to sandwich one ground via hole 18, while the feedthrough capacitor C2 is disposed on the row i2 adjacent to the row i1, between the power supply via holes 17c and 17d aligned so as to sandwich one ground via hole 18. In other words, the feedthrough capacitors C1 and C2 are disposed such that the longitudinal directions of their bodies 2 are oriented to the row direction. Alternatively, the feedthrough capacitors C1 and C2 may also be disposed such that the longitudinal directions of their bodies 2 are oriented to the column direction. In other words, the feedthrough capacitor C1 may be disposed on the column k1, between the power supply via holes 17 aligned so as to sandwich one ground via hole 18, while the feedthrough capacitor C2 may be disposed on the column k2 adjacent to the column k1, between the power supply via holes 17 aligned so as to sandwich one ground via hole 18. As described above, the feedthrough capacitors C1 and C2 may be disposed between the power supply via holes 17 aligned in the column direction instead of the row direction.

The power supply via holes 17a and 17b are disposed in a row adjacent to a row having the power supply via holes 17c and 17d as described above, but these rows do not have to be adjacent to each other. The power supply via holes 17a and 17b disposed in a row adjacent to a row having the power supply via holes 17c and 17d bring the feedthrough capacitors C1 and C2 closer to each other, thereby ensuring that magnetic fields caused by the currents cancel each other more effectively. This can ensure that the ESL caused by the feedthrough capacitors is reduced more effectively.

The feedthrough capacitors C1 and C2 are disposed so that the region between the terminal electrode 3 and the ground electrodes 5 and 6 of the feedthrough capacitor C1 and the region between the terminal electrode 4 and the ground electrodes 5 and 6 of the feedthrough capacitor C2 face each other as described above, but the structure is not restricted to this. For example, the feedthrough capacitors C1 and C2 may be disposed so as to face each other in smaller regions (for example, regions only around the terminal electrode 3 of the feedthrough capacitor C1 and around the terminal electrode 4 of the feedthrough capacitor C2). Alternatively, the feedthrough capacitors C1 and C2 may be disposed so as to face each other in wider regions (for example, regions in the feedthrough capacitor C1 other than the terminal electrode 4 and in the feedthrough capacitor C2 other than the terminal electrode 3). In these cases, currents in the feedthrough capacitors C1 and C2 also flow in opposite directions at least partially, thereby canceling magnetic fields caused by the currents partially to reduce the ESL. From the viewpoint of more effective canceling for magnetic fields caused by the currents, the region between the terminal electrode 3 and the ground electrodes 5 and 6 of the feedthrough capacitor C1 and the region between the terminal electrode 4 and the ground electrodes 5 and 6 of the feedthrough capacitor C2 preferably face each other, as described above.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A structure for mounting a first feedthrough capacitor and a second feedthrough capacitor on a mounting surface of a substrate,
wherein the substrate is an insulating substrate including a first internal conductor and a second internal conductor insulated from each other, and includes first via holes extending from the mounting surface to the first internal conductor, second via holes extending from the mounting surface to the second internal conductor, a first land electrode formed on the mounting surface and connected to the first via hole, and a second land electrode formed on the mounting surface and connected to the second via hole insulated from the first land electrode,
the first and second via holes being alternatively aligned in a matrix, and in the row and column directions in the mounting surface,
the first and second feedthrough capacitors each including a element body, two first terminal electrodes disposed on two opposite first end faces in the longitudinal direction of the element body, and second terminal electrodes disposed on second end faces orthogonal to the longitudinal direction of the element body,
the first feedthrough capacitor being disposed between the two first via holes in a given row or column in the mounting surface,
one of the first terminal electrodes in the first feedthrough capacitor being disposed on one of the two first via holes, and connected to the first land electrode,
the other of the first terminal electrodes in the first feedthrough capacitor being disposed on the other of the two first via holes, and connected to the first land electrode,
the second terminal electrodes in the first feedthrough capacitor being connected to the second land electrode,
the second feedthrough capacitor being disposed between the two first via holes in a row or column parallel to the given row or column in the mounting surface so as to partially face the first feedthrough capacitor,
one of the first terminal electrodes in the second feedthrough capacitor being disposed on one of the two first via holes, and connected to the first land electrode,
the other of the first terminal electrodes in the second feedthrough capacitor being disposed on the other of the two first via holes, and connected to the first land electrode,
the second terminal electrodes in the second feedthrough capacitor being connected to the second land electrode.

2. The structure according to claim 1,
wherein a region between one of the first end faces and a region for forming the second terminal electrodes in the element body of the first feedthrough capacitor faces a region between one of the first end faces and a region for forming the second terminal electrodes in the element body of the second feedthrough capacitor,
a region between the other of the first end faces and a region for forming the second terminal electrodes in the element body of the first feedthrough capacitor not facing a region between the other of the first end faces and a region for forming the second terminal electrodes in the element body of the second feedthrough capacitor.

3. The structure according to claim 2,
wherein the second feedthrough capacitor is disposed between the two first via holes in a row or column adjacent to the given row or column.

4. The structure according to claim 1,
wherein the second feedthrough capacitor is disposed between the two first via holes in a row or column adjacent to the given row or column.

* * * * *